United States Patent
Yi et al.

(10) Patent No.: US 12,336,245 B2
(45) Date of Patent: Jun. 17, 2025

(54) HIGH ELECTRON MOBILITY TRANSISTOR AND METHOD FOR FABRICATING THE SAME

(71) Applicant: UNITED MICROELECTRONICS CORP., Hsin-Chu (TW)

(72) Inventors: Yen-Tsai Yi, Tainan (TW); Wei-Chuan Tsai, Changhua County (TW); Jin-Yan Chiou, Tainan (TW); Hsiang-Wen Ke, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 406 days.

(21) Appl. No.: 17/851,048

(22) Filed: Jun. 28, 2022

(65) Prior Publication Data
US 2023/0387280 A1 Nov. 30, 2023

(30) Foreign Application Priority Data
May 30, 2022 (CN) .......................... 202210597758.2

(51) Int. Cl.
*H01L 29/778* (2006.01)
*H01L 23/31* (2006.01)
(Continued)

(52) U.S. Cl.
CPC ....... *H10D 62/343* (2025.01); *H01L 23/3171* (2013.01); *H10D 30/015* (2025.01); *H10D 30/6738* (2025.01); *H10D 30/675* (2025.01); *H10D 62/151* (2025.01); *H10D 62/161* (2025.01); *H10D 62/85* (2025.01); *H10D 62/8503* (2025.01); *H10D 64/62* (2025.01); *H10D 64/64* (2025.01); *H10D 30/4732* (2025.01)

(58) Field of Classification Search
CPC ............. H01L 29/0847; H01L 29/0891; H01L 29/1066; H01L 29/2003; H01L 29/452; H01L 29/475; H01L 29/66462; H01L 29/7783; H01L 23/3171; H10D 62/151; H10D 62/161; H10D 62/343; H10D 62/8503; H10D 62/881; H10D 62/85; H10D 62/824; H10D 62/852; H10D 62/854; H10D 30/015; H10D 30/4732
See application file for complete search history.

(56) References Cited

U.S. PATENT DOCUMENTS 10,720,331 B2 * 7/2020 Raisanen .......... C23C 16/45527
2011/0272742 A1 * 11/2011 Akiyama .......... H01L 29/41725
257/E21.403

(Continued)

*Primary Examiner* — Victoria K. Hall
(74) *Attorney, Agent, or Firm* — Winston Hsu

(57) ABSTRACT

A method for fabricating high electron mobility transistor (HEMT) includes the steps of forming a buffer layer on a substrate, forming a barrier layer on the buffer layer, forming a p-type semiconductor layer on the barrier layer, forming a titanium nitride (TiN) layer on the p-type semiconductor layer as a nitrogen to titanium (N/Ti) ratio of the TiN layer is greater than 1, forming a passivation layer on the TiN layer and the barrier layer, removing the passivation layer to form an opening, forming a gate electrode in the opening, and then forming a source electrode and a drain electrode adjacent to two sides of the gate electrode on the barrier layer.

12 Claims, 1 Drawing Sheet

(51) Int. Cl.
    *H01L 29/08*     (2006.01)
    *H01L 29/20*     (2006.01)
    *H01L 29/66*     (2006.01)
    *H10D 30/01*     (2025.01)
    *H10D 30/67*     (2025.01)
    *H10D 62/13*     (2025.01)
    *H10D 62/17*     (2025.01)
    *H10D 62/85*     (2025.01)
    *H10D 64/62*     (2025.01)
    *H10D 64/64*     (2025.01)
    *H10D 30/47*     (2025.01)

(56) References Cited

U.S. PATENT DOCUMENTS

| | | | |
|---|---|---|---|
| 2015/0221559 A1* | 8/2015 | Kang | H01L 21/28008 |
| | | | 438/587 |
| 2016/0071732 A1* | 3/2016 | Nishii | H01L 21/28264 |
| | | | 438/795 |
| 2017/0077255 A1 | 3/2017 | Yao et al. | |
| 2017/0133500 A1* | 5/2017 | Etou | H01L 27/098 |
| 2017/0317183 A1* | 11/2017 | Kato | H01L 21/28264 |
| 2019/0103464 A1* | 4/2019 | Izumi | H01L 29/7813 |
| 2020/0035481 A1* | 1/2020 | Tapily | C30B 25/00 |
| 2020/0328297 A1* | 10/2020 | Li | H01L 29/7789 |
| 2021/0175343 A1* | 6/2021 | Chen | H01L 29/7786 |
| 2021/0233817 A1* | 7/2021 | Lee | H01L 29/66545 |
| 2021/0336045 A1* | 10/2021 | Oh | H10D 62/343 |
| 2022/0109058 A1* | 4/2022 | Chang | H01L 29/7787 |
| 2022/0254894 A1* | 8/2022 | Constant | H01L 29/7783 |
| 2023/0231044 A1* | 7/2023 | Yang | H01L 23/3171 |
| | | | 257/194 |

* cited by examiner

HIGH ELECTRON MOBILITY TRANSISTOR AND METHOD FOR FABRICATING THE SAME

BACKGROUND OF THE INVENTION

1. Field of the Invention

The invention relates to a high electron mobility transistor (HEMT) and fabrication method thereof.

2. Description of the Prior Art

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

According to an embodiment of the present invention, a method for fabricating high electron mobility transistor (HEMT) includes the steps of forming a buffer layer on a substrate, forming a barrier layer on the buffer layer, forming a p-type semiconductor layer on the barrier layer, forming a titanium nitride (TiN) layer on the p-type semiconductor layer as a nitrogen to titanium (N/Ti) ratio of the TiN layer is greater than 1, forming a passivation layer on the TiN layer and the barrier layer, removing the passivation layer to form an opening, forming a gate electrode in the opening, and then forming a source electrode and a drain electrode adjacent to two sides of the gate electrode on the buffer layer.

According to another aspect of the present invention, a high electron mobility transistor (HEMT) includes a buffer layer on a substrate, a barrier layer on the buffer layer, a p-type semiconductor layer on the barrier layer, and a titanium nitride (TiN) layer on the p-type semiconductor layer. Preferably, a nitrogen to titanium (N/Ti) ratio of the TiN layer is greater than 1.

These and other objectives of the present invention will no doubt become obvious to those of ordinary skill in the art after reading the following detailed description of the preferred embodiment that is illustrated in the various FIGURES and drawings.

DETAILED DESCRIPTION

Figure 1:
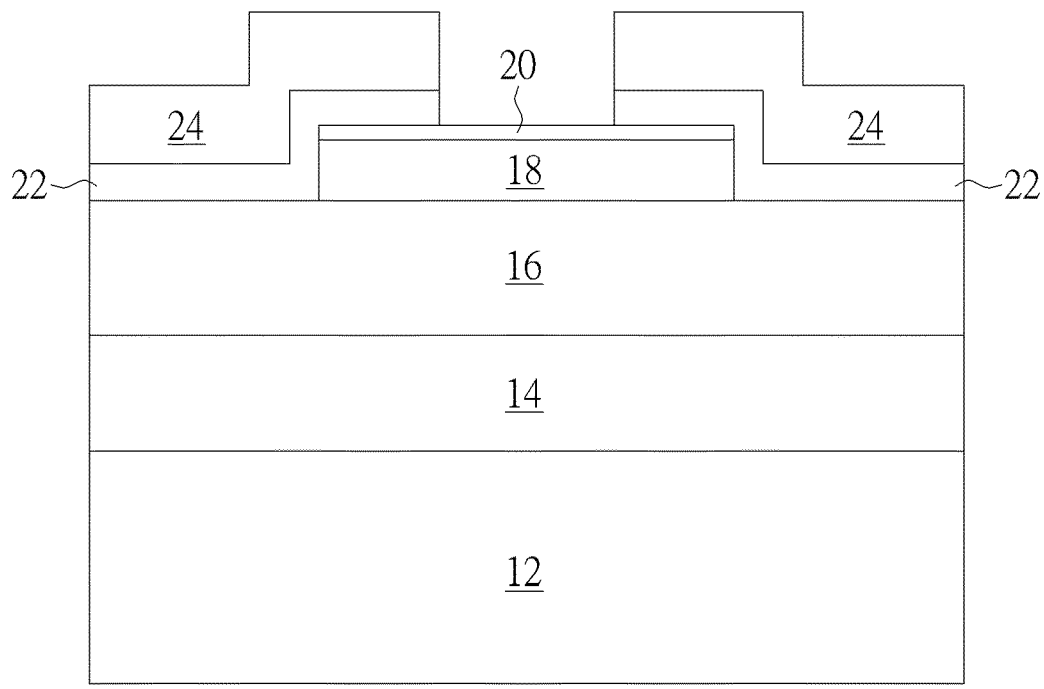
FIGS. 1-2 illustrate a method for fabricating a HEMT according to an embodiment of the present invention.
Figure 2:
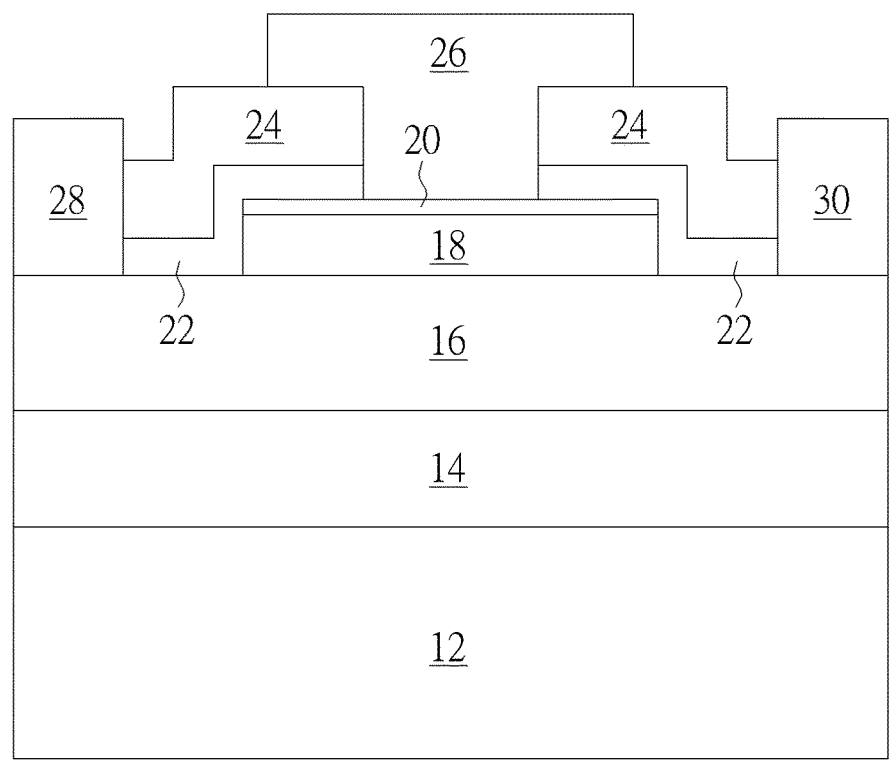

Referring to FIGS. 1-2, FIGS. 1-2 illustrate a method for fabricating a HEMT according to an embodiment of the present invention. As shown in FIG. 1, a substrate 12 such as a substrate made from silicon, silicon carbide, or aluminum oxide (or also referred to as sapphire) is provided, in which the substrate 12 could be a single-layered substrate, a multi-layered substrate, gradient substrate, or combination thereof. According to other embodiment of the present invention, the substrate 12 could also include a silicon-on-insulator (SOI) substrate.

Next, a selective nucleation layer (not shown) and a buffer layer 14 are formed on the substrate 12. According to an embodiment of the present invention, the nucleation layer preferably includes aluminum nitride (AlN) and the buffer layer 14 is preferably made of III-V semiconductors such as gallium nitride (GaN), in which a thickness of the buffer layer 14 could be between 0.5 microns to 10 microns. According to an embodiment of the present invention, the formation of the buffer layer 14 on the substrate 12 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a selective unintentionally doped (UID) buffer layer (not shown) could be formed on the surface of the buffer layer 14. In this embodiment, the UID buffer layer is preferably made of III-V semiconductors such as gallium nitride (GaN) or more specifically unintentionally doped GaN. According to an embodiment of the present invention, the formation of the UID buffer layer on the buffer layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a barrier layer 16 is formed on the surface of the buffer layer 14 or UID buffer layer. In this embodiment, the barrier layer 16 is preferably made of III-V semiconductor such as n-type or n-graded aluminum gallium nitride ($Al_xGa_{1-x}N$), in which $0<x<1$, the barrier layer 20 preferably includes an epitaxial layer formed through epitaxial growth process, and the barrier layer 16 could include dopants such as silicon or germanium. Similar to the buffer layer 14, the formation of the barrier layer 16 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a p-type semiconductor layer 18 and a metal nitride layer such as a titanium nitride (TiN) layer 20 is formed on the barrier layer 16 and then a photo-etching process is conducted to remove part of the TiN layer 20 and part of the p-type semiconductor layer 18. In this embodiment, the p-type semiconductor layer 18 is a III-V compound semiconductor layer preferably including p-type GaN (pGaN) and the formation of the p-type semiconductor layer 18 on the barrier layer 16 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

It should be noted that during the formation of the TiN layer 20, it would be desirable to adjust the power of the semiconductor equipment and the ratio of the gas injected so that the nitrogen to titanium (N/Ti) ratio of the TiN layer 20 is greater than 1 or more specifically at 1.042 and a (200) orientation to (111) orientation or (200)/(111) orientation ratio of the TiN layer 20 is greater than 0.6. Preferably, the (200)/(111) orientation ratio at the center region of the TiN layer 20 is adjusted between 0.735 to 0.745 or most preferably at 0.740 while the (200)/(111) orientation ratio at the edge region of the TiN layer 20 is between 0.730 to 0.740 or most preferably at 0.734. By using the aforementioned parameters to adjust the nitrogen to titanium (N/Ti) ratio and the ratio between (200) orientation and (111) orientation of the TiN layer 20, it would be desirable to increase the overall strength of the TIN layer 20 thereby improving protection for the p-type semiconductor layer 18 underneath.

Next, as shown in FIGS. 1-2, a passivation layer 22 and another passivation layer 24 are formed on the surface of the TiN layer 20 and the barrier layer 16, and then a gate electrode 26 is formed on the TiN layer 20 and a source electrode 28 and a drain electrode 30 are formed adjacent to two sides of the gate electrode 28. In this embodiment, the passivation layers 22 and 24 are preferably made of different materials, in which the passivation layer 22 is preferably made of aluminum oxide (AlO) while the passivation layer 24 is made of tetraethyl orthosilicate (TEOS). The formation of the gate electrode 26, the source electrode 28, and the drain electrode 30 could be accomplished by first conducting a photo-etching process to remove part of the passivation layers 22 and 24 directly on the p-type semiconductor layer 18 or TiN layer 20 for forming an opening (not shown), a gate electrode 26 is formed in the opening, removing part of the passivation layers 22, 24 adjacent to two sides of the gate electrode 26, and then forming the source electrode 28 and drain electrode 30 adjacent to two sides of the gate electrode 26.

In this embodiment, the gate electrode 26, the source electrode 28, and the drain electrode 30 are preferably made of metal, in which the gate electrode 26 is preferably made of Schottky metal while the source electrode 28 and the drain electrode 30 are preferably made of ohmic contact metals. According to an embodiment of the present invention, each of the gate electrode 26, source electrode 28, and drain electrode 30 could include gold (Au), Silver (Ag), platinum (Pt), titanium (Ti), aluminum (Al), tungsten (W), palladium (Pd), or combination thereof. Preferably, it would be desirable to conduct an electroplating process, sputtering process, resistance heating evaporation process, electron beam evaporation process, physical vapor deposition (PVD) process, chemical vapor deposition (CVD) process, or combination thereof to form electrode materials in the aforementioned openings, and then pattern the electrode materials through one or more etching processes to form the gate electrode 26, source electrode 28, and the drain electrode 30. This completes the fabrication of a HEMT according to an embodiment of the present invention.

Overall, the present invention preferably adjusts the power of the semiconductor equipment and the ratio of the gas injected when the TiN layer 20 is formed on the surface of the p-type semiconductor layer 18 so that the nitrogen to titanium (N/Ti) ratio of the TiN layer 20 is greater than 1 of more specifically at 1.042 and a (200)/(111) orientation ratio of the TiN layer 20 is greater than 0.6. Preferably, the (200)/(111) orientation ratio at the center region of the TiN layer 20 is adjusted between 0.735 to 0.745 or most preferably at 0.740 whereas the (200)/(111) orientation ratio at the edge region of the TiN layer 20 is between 0.730 to 0.740 or most preferably at 0.734. By using the aforementioned parameters to adjust the nitrogen to titanium (N/Ti) ratio and the ratio between (200) orientation and (111) orientation of the TiN layer 20, it would be desirable to increase the overall strength of the TiN layer 20 thereby improving protection for the p-type semiconductor layer 18 underneath.

The TiN layer formed by the aforementioned process according to the present invention exhibits both anti-etching and anti-oxidation features. With regards to the anti-etching feature, 13 nm or more, e.g., 13.35 nm, of thickness of a conventional TiN layer might be lost due to etching in the manufacturing process, while only 7.25 nm of thickness of the TiN layer formed according to the present invention could be lost. On the other hand, with regards to the anti-oxidation feature, 4 nm or more, e.g., 4.962 nm or more, of thickness of a conventional TiN layer might be lost due to oxidation in the manufacturing process, while only 2.29 nm of thickness of the TiN layer according to the present invention could be lost. The high electron mobility transistor comprising the TIN layer fabricated according to the aforementioned approach shows significant improvement in both anti-etching and anti-oxidation features.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating high electron mobility transistor (HEMT), comprising:
    forming a buffer layer on a substrate;
    forming a barrier layer on the buffer layer;
    forming a p-type semiconductor layer on the barrier layer;
    forming a titanium nitride (TiN) layer on the p-type semiconductor layer;
    forming a passivation layer on the TiN layer and the barrier layer and in contact with the p-type semiconductor layer;
    removing the passivation layer to form an opening to expose the TiN layer; and
    forming a gate electrode in the opening and in contact with the TiN layer,
    wherein the TiN layer is nitrogen-rich.

2. The method of claim 1, further comprising:
    forming a source electrode and a drain electrode adjacent to two sides of the gate electrode on the barrier layer.

3. The method of claim 1, wherein a (200)/(111) orientation ratio of the TiN layer is greater than 0.6 and less than 1.

4. The method of claim 1, wherein the buffer layer comprises gallium nitride (GaN).

5. The method of claim 1, wherein the barrier layer comprise $Al_xGa_{1-x}N$.

6. The method of claim 1, wherein the p-type semiconductor layer comprises p-type gallium nitride (pGaN).

7. A high electron mobility transistor (HEMT), comprising:
    a buffer layer on a substrate;
    a barrier layer on the buffer layer;
    a p-type semiconductor layer on the barrier layer;
    a titanium nitride (TiN) layer on the p-type semiconductor layer;
    a passivation layer on the TiN layer and the barrier layer and in contact with the p-type semiconductor layer; and
    a gate electrode in the passivation layer and in contact with the TiN layer,
    wherein the TiN layer is nitrogen-rich.

8. The HEMT of claim 7, further comprising:
    a source electrode and a drain electrode adjacent to two sides of the gate electrode on the barrier layer.

9. The HEMT of claim 7, wherein a (200)/(111) orientation ratio of the TiN layer is greater than 0.6 and less than 1.

10. The HEMT of claim 7, wherein the buffer layer comprises gallium nitride (GaN).

11. The HEMT of claim 7, wherein the barrier layer comprise $Al_xGa_{1-x}N$.

12. The HEMT of claim 7, wherein the p-type semiconductor layer comprises p-type gallium nitride (pGaN).

* * * * *